United States Patent [19]

Raudorf

[11] 4,237,470

[45] Dec. 2, 1980

[54] HYPERPURE GERMANIUM COAXIAL RADIATION DETECTOR

[75] Inventor: Thomas W. Raudorf, Oak Ridge, Tenn.

[73] Assignee: ORTEC Incorporated, Oak Ridge, Tenn.

[21] Appl. No.: 888,236

[22] Filed: Mar. 20, 1978

[51] Int. Cl.² .......................................... H01L 27/14
[52] U.S. Cl. ...................................... 357/30; 357/29; 250/370; 357/55
[58] Field of Search ............................. 357/30, 55, 29; 250/370

[56] References Cited

U.S. PATENT DOCUMENTS

| | | | |
|---|---|---|---|
| 3,781,612 | 12/1973 | Llacer | 317/234 |
| 4,056,726 | 11/1977 | Harchol | 250/370 |

Primary Examiner—Martin H. Edlow
Attorney, Agent, or Firm—Brumbaugh, Graves, Donohue & Raymond

[57] ABSTRACT

A radiation detector made of hyperpure germanium has generally the shape of a hollow cylinder with an outer generally cylindrical surface and an inner generally cylindrical surface and is formed with a p+ contact and n+ contact. One of the contacts is on the outer cylindrical surface of the semiconductor and the other is on the inner cylindrical surface, and both contacts are themselves cylindrical. Each cylinder formed by a contact is open at at least one end thereof, the open ends being adjacent rather than opposite ends of the respective cylinders. One of the contacts is a thin contact, having a thickness of one micron or less. The germanium crystal is formed with an annular groove coaxial with the contacts and extending to within one millimeter of the thin contact at a position inward of the open end of the thin contact. Thus, when a reverse bias is applied across the germanium crystal between the contacts, the resulting equipotential lines are relatively crowded at the groove, the electric field is of reduced strength adjacent the open end of the thin contact, and reverse leakage current is inhibited.

7 Claims, 2 Drawing Figures

HYPERPURE GERMANIUM COAXIAL RADIATION DETECTOR

BACKGROUND OF THE INVENTION

This invention relates to radiation detectors and, more particularly, to novel and highly-effective radiation detectors made of a semiconductor such as hyperpure germanium and having a coaxial configuration.

The use of semiconductors to detect incident radiation is a well-developed art. When a semiconductor diode is subjected to a reverse bias, the ionization caused by incident radiation permits a pulsed current to flow. The current can be detected and analyzed to provide a great deal of information about the incident radiation.

To minimize noise and maximize sensitivity, it is necessary to minimize leakage currents. Surface leakage currents are a major problem, and a means for reducing them in a planar-type lithium-drifted silicon detector is disclosed by J. Llacer in "Geometric Control of Surface Leakage Current and Noise in Lithium Drifted Silicon Radiation Detectors", IEEE Trans. on Nucl. Sci. NS-13 No. 1, 93 (1966). Basically, Llacer proposed an "inverted T" geometry including a groove between the intrinsic and p regions of a lithium-drifted planar silicon detector, with structural and functional results as indicated in FIGS. 8, 9 and 12 of his paper.

However, detectors of this type are not as advantageous in many applications as are coaxial detectors. Coaxial detectors have generally the shape of a hollow cylinder with outer and inner cylindrical surfaces. One of the cylindrical surfaces—generally the outer one—has a cylindrical n+ contact and the other a cylindrical p+ contact. The cylinders formed by the contacts are opened at at least one and sometimes at both ends.

Coaxial detectors are preferable to planar detectors in applications such as the detection of high-energy (e.g., 1 MeV) gamma radiation in that coaxial detectors can be made much larger than planar detectors and perform admirably in large sizes. Planar detectors cannot be readily made in large sizes, and near the upper limit of their size range they exhibit non-uniform electric field characteristics that degrade performance. A particularly desirable type of coaxial detector would be one having a thin contact on the outer surface, since a thin contact absorbs little of the energy of incident radiation prior to penetration of the radiation into the sensitive volume of the detector. However, this type of coaxial detector has been unsatisfactory because of excessive surface-leakage currents even at voltages far below those necessary for depletion. Current in the form of minority carriers is especially prone to leak from the open end of a thin p+ contact.

It is also particularly desirable to choose as the semiconductor a material the electrical characteristics of which remain stable at room temperature. Such materials include hyperpure germanium: i.e., germanium in which the concentration of net residual active impurities is below $5 \times 10^{10}$ cm$^{-3}$. Radiation detectors are operated at cryogenic temperatures, but hyperpure germanium detectors have great stability and need not be shipped and stored at cryogenic temperatures. Lithium-drifted germanium detectors, on the other hand, must be not only operated but also shipped and stored at cryogenic temperatures. In case of accidental loss (as by evaporation) of the liquid nitrogen bath used as a refrigerant, a lithium-drifted germanium detector is ruined by heat in just a few hours. Lithium-drifted silicon detectors under the same conditions are serviceable for only a matter of months.

SUMMARY OF THE INVENTION

An object of the invention is to remedy the problems of conventional radiation detectors outlined above. In particular, an object of the invention is to provide a radiation detector of coaxial configuration which is subject to low leakage current and hence is capable of operation at extremely low noise levels. Another object of the invention is to provide a coaxial radiation detector the electrical characteristics of which are stable at room temperature so that the cost of shipping and storage is reduced and the detector can survive the accidental loss of refrigerant during operation.

The foregoing and other objects of the invention are attained in a radiation detector comprising a semiconductor having generally the shape of a hollow cylinder with an outer generally cylindrical surface and an inner generally cylindrical surface. A p+ contact is provided on either the outer or the inner cylindrical surface, and an n+ contact is provided on the other cylindrical surface. The contacts themselves are generally cylindrical and coaxial, and the respective cylinders formed by each of the contacts are open at at least one end thereof, the open ends being adjacent to each other. One of the contacts—given the capabilities of today's technology, the p+ contact—is a "thin" contact. In accordance with the invention, the semiconductor is formed with an annular groove coaxial with the contacts and extending to a position which is closely spaced apart from the thin contact and inward of the open end of the thin contact, whereby, when a reverse bias is applied across the semiconductor between the contacts, the resulting equipotential lines are relatively crowded at the groove, the electric field is of reduced strength adjacent the open end of the thin contact, and reverse leakage current is inhibited. Also, the resistivity of an n-type surface channel which may on occasion exist across the open end or ends of the coaxial detector is greatly increased by the large electric field that would exist between it and the p+ contact in the groove region, again resulting in a decrease of reverse leakage. This effect was first described by W. L. Brown, Phys. Rev. Vol. 91, No. 3, page 518 (August 1953), in general and by J. Llacer in the reference cited above with respect to nuclear radiation detectors of planar construction.

A "thin" contact normally has a thickness of one micron or less. An especially good thin contact can be formed by boron implantation in hyperpure germanium. An accelerator accelerates boron ions to an energy of about 30 KeV in order to accomplish the implantation.

An n+ contact is easily formed by a well-known process involving lithium diffusion without drift. The diffusion involves heating and results in sufficient molecular mobility to enable a penetration of the lithium into a semiconductor crystal such as hyperpure germanium to a depth of a hundred microns or more. In such a relatively thick contact, surface leakage current is not a particular problem, but in the case of a thin contact, it is a very serious problem. The structure including the annular groove in accordance with the present invention deals with the problem in a highly-effective manner.

The invention in its preferred embodiments is characterized by a number of additional features. Thus for reasons indicated above the semiconductor is preferably formed of hyperpure germanium: i.e., germanium in which the concentration of net residual active impurities is below $5 \times 10^{10}$ cm$^{-3}$. Moreover, the p+ contact preferably comprises implanted boron and the n+ contact preferably comprises diffused lithium. Either the p+ contact or the n+ contact can be on the outer cylindrical surface of the semiconductor and the other contact on the inner cylindrical surface. In the preferred embodiment, the p+ contact is on the outer cylindrical surface, since the p+ contact can be made very thin for minimum absorption of incident radiation prior to penetration of the radiation into the sensitive volume of the detector.

BRIEF DESCRIPTION OF THE DRAWING

A better understanding of the invention can be gained from a consideration of the following detailed description of the preferred embodiments thereof, in conjunction with the appended drawing, wherein.

DESCRIPTION OF THE PREFERRED EMBODIMENTS

Figure 1:
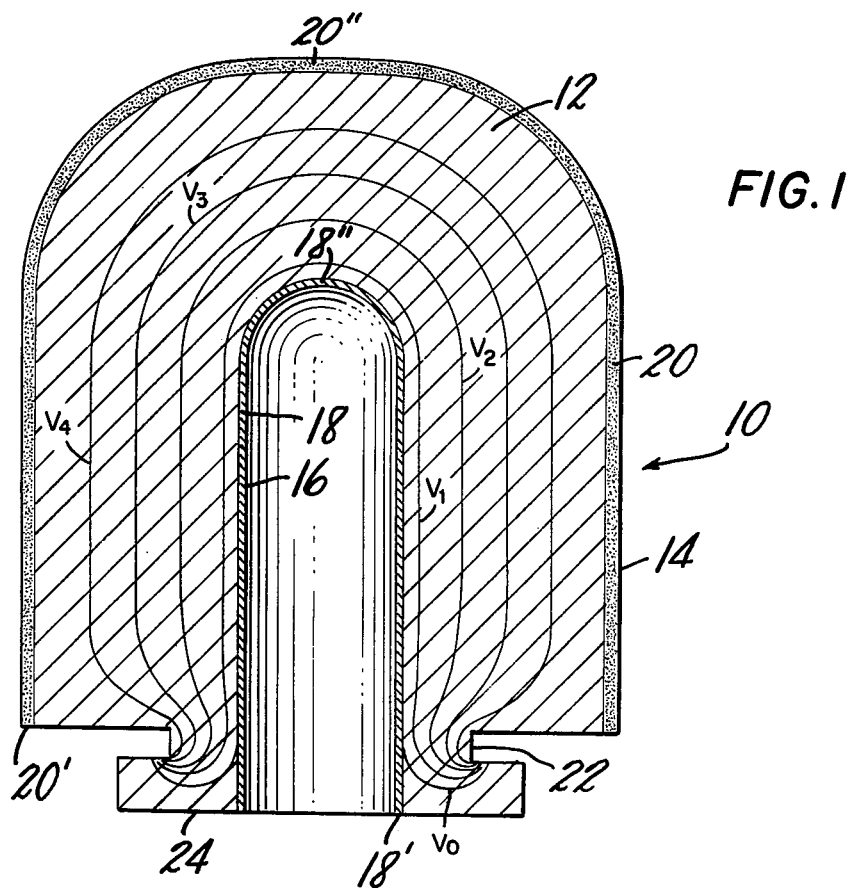
FIG. 1 is a sectional view in a plane containing the axis of a coaxial semiconductor in accordance with the invention wherein a thin p+ contact is on the inner cylindrical surface of the semiconductor and a thicker n+ contact is on the outer cylindrical surface of the semiconductor.

FIG. 1 shows a radiation detector 10 in accordance with the invention. It comprises a semiconductor 12 having generally the shape of a hollow cylinder with an outer generally cylindrical surface 14 and an inner generally cylindrical surface 16. The detector 10 is formed with a p+ contact 18 and an n+ contact 20. In principle either contact can be on either cylindrical surface. In FIG. 1, the n+ contact 20 is on the outer cylindrical surface, and the p+ contact 18 is on the inner cylindrical surface.

The contacts 18 and 20 are themselves generally cylindrical and coaxial with each other and with the inner and outer cylindrical surfaces 16, 14 of the detector 10. The terms "generally cylindrical" and "generally coaxial" admit of reasonable departure from the strict geometric meanings of the terms. The respective cylinders formed by the contacts 18 and 20 are open at at least one end thereof. As FIG. 1 shows, they are open at their ends 18' and 20', which ends are adjacent ends rather than opposite ends of the respective cylinders. The ends 18'' and 20'' of the respective cylinders are closed, though it is within the scope of the invention to leave them open.

One of the contacts is a thin contact, and in the case of FIG. 1 it is the contact 18 which is the thin contact. Given the capabilities of today's technology, a p+ contact can easily be made as thin as one micron and can even be made an order of magnitude thinner than this. While a thin contact has many advantages, particularly in the embodiment of FIG. 2, it also has heretofore has the disadvantage of tending to be a source of surface leakage currents. Because of the extreme thinness of the contact, electric charge in the form of minority carriers readily escapes from the open end of a thin contact of a coaxial detector not incorporating the present invention and flows across the end surface of the cylinder between the p+ and n+ contacts when the dectector is subjected to a reverse bias. This flow of current represents a "noise" that tends to mask the pulsed current arising in response to the incident radiation. In other words, the signal-to-noise ratio of conventional coaxial detectors having a thin contact is considerably lower than one would wish it to be.

In accordance with the present invention, the semiconductor 12 is formed with an annular groove 22 generally coaxial with the contacts 18 and 20 and extending to a position which is closely spaced apart (e.g., by 1 mm or less) from the thin contact 18 and inward of the open end 18' of the thin contact 18. Thus when a reverse bias is developed across the semiconductor 12 by applying a positive voltage to the n+ contact 20 and a negative voltage to the p+ contact 18, the resulting equipotential lines $V_0$, $V_1$, $V_2$, $V_3$, $V_4$, etc., are relatively crowded at the groove 22. This increases the electric field strength there and reduces it adjacent the open end 18' of the thin contact 18, thereby inhibiting reverse leakage current.

As indicated above, the detector 10 preferably is characterized by a number of additional features that contribute to its efficient operation. Thus the semiconductor 12 is formed of hyperpure germanium: i.e., of a germanium crystal in which the concentration is net residual active impurities is below $5 \times 10^{10}$ cm$^{-3}$. Such crystals are available commercially. Moreover, the p+ contact preferably consists essentially of implanted boron, and the n+ contact consists essentially of diffused lithium. The boron may be implanted, as indicated previously, using an accelerator to impart a kinetic energy to boron ions of about 30 KeV. This causes implantation to a depth of only about 600 angstrom units or less than one-tenth of a micron. Finally, the n+ contact comprises lithium diffused to a depth of 100 microns or more. Thus the n+ contact is typically more than three orders of magnitude thicker than the p+ contact, and the figures of the drawing, in so far as they illustrate the thickness of the contacts, are not drawn to scale.

Presently technology does not lend itself very well to the production of detectors having contacts of a thickness within the range from about 1 micron to about 100 microns. When suitable technology is developed, it is expected that the present invention will be applicable to semiconductors having contacts considerably thicker than one micron. Thus a "thin" contact is understood to mean one thin enough to present problems of leakage current.

In the embodiment of FIG. 1, the n+ contact 20 is on the outer cylindrical surface 14 of the semiconductor 12, the p+ contact 18 is on the inner cylindrical surface 16 of the semiconductor, and the radially-inner portion of the semiconductor 12 is formed with a button-like axial extension 24 beyond the open end 20' of the n+ contact. The annular groove 22 is formed in the button-like extension 24.

Figure 2:
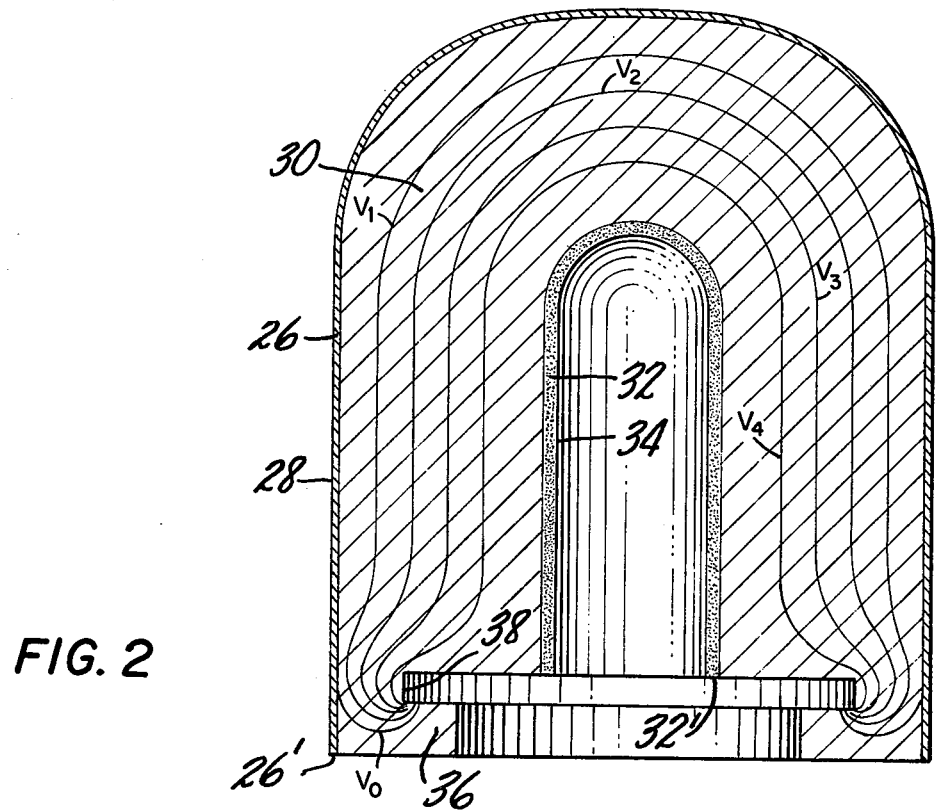
FIG. 2 is a view similar to FIG. 1 and showing a semiconductor which represents the best mode now known for practicing the invention, wherein the thin p+ contact is on the outer cylindrical surface of the semiconductor and the thicker n+ contact is on the inner cylindrical surface.

In the embodiment of FIG. 2, which represents the best mode contemplated by the inventor for carrying out the invention, the thin p+ contact 26 is on the outer cylindrical surface 28 of the semiconductor 30, and the thicker n+ contact 32 is on the inner cylindrical surface 34 of the semiconductor 30. In this case, the radially-outer portion of the semiconductor 30 is formed with a rim-like axial extension 36 beyond the open end 32' of the n+ contact 32, and an annular groove 38 is formed in the rim-like extension. The annular groove 38 is coaxial with the contacts 26 and 32 and extends to a position which is closely spaced apart (e.g., by 1 mm or less) from the thin contact 26 and inward of the open end 26' of the thin contact. Thus when a reverse bias is developed across the semiconductor 30 between the contacts 26 and 32 the resulting equipotential lines $V_0$, $V_1$, $V_2$, $V_3$, $V_4$, etc., are relatively crowded at the groove 38, the corresponding electric field is of increased strength at the groove 38 and of reduced strength adjacent to the open end 26' of the thin contact 26, and reverse leakage current from the open end 26' is inhibited.

The embodiment of FIG. 2 is particularly advantageous for radiation detection, since the contact 26, being a boron-implanted p+ contact, can be made very thin, for example of the order of 1/10th of a micron. Arranging the thin contact rather than the thick contact on the outer surface of the semiconductor 30 provides a virtually transparent window for the radiation incident on the semiconductor 30; the contact absorbs only negligible incident radiation, and practically all of the incident radiation is absorbed by the semiconductor crystal 30 in the large sensitive volume between the contacts 26 and 32.

Thus there is provided in accordance with the invention a novel and highly-effective radiation detector that exhibits outstanding signal-to-noise ratios, that has stable electrical characteristics at room temperature, that can be made with the large sensitive volume desired in the detection of high-energy radiation, and that, especially in the embodiment of FIG. 2, is extraordinarily sensitive.

Many modifications of the preferred embodiments of the invention disclosed above and illustrated in the drawing will readily occur to those skilled in the art upon consideration of this disclosure. For example, while the special geometry of the invention is particularly adapted to semiconductors formed of hyperpure germanium, the geometry is applicable in principle to other detectors. Likewise, while the figures of the drawing illustrate single-open-ended detectors, the invention is applicable equally to double-open-ended detectors, formed at both ends with annular grooves according to the invention. Moreover, if it were technologically possible to make both the p+ contact and the n+ contact "thin" contacts within the meaning of the present specification, then an annular groove in accordance with the invention would be associated with both contacts: i.e., the features of FIGS. 1 and 2 would be combined in a single detector, for example one having both rim-like and button-like extensions accommodating grooves according to the invention. Finally, the annular groove can be dispensed with if the wall thickness of the cylindrical extension is a millimeter or less. Accordingly, the invention extends to all structure covered by the appended claims and equivalents thereof.

I claim:

1. A radiation detector comprising a semiconductor having generally the shape of a hollow cylinder with an outer generally cylindrical surface and an inner generally cylindrical surface and being formed with a p+ contact and an n+ contact, the p+ contact being on the outer cylindrical surface and the n+ contact being on the inner cylindrical surface, said contacts being generally cylindrical and coaxial, the respective cylinders formed by each of said contacts being open at at least one end thereof, said open ends being adjacent to each other, and one of said contacts being a thin contact, characterized in that the radially-outer portion of the semiconductor is formed with a rim-like axial extension beyond the open end of the n+ contact, and that the semiconductor is formed with an annular groove coaxial with the contacts and extending to a position which is closely spaced apart from the thin contact and inward of the open end of the thin contact, whereby, when a reverse bias is applied across the semiconductor between the contacts, the resulting equipotential lines are relatively crowded at the groove, the electric field is of reduced strength adjacent the open end of the thin contact, and reverse leakage current is inhibited.

2. A radiation detector comprising a semiconductor having generally the shape of a hollow cylinder with an outer generally cylindrical surface and an inner generally cylindrical surface and being formed with a p+ contact and an n+ contact, the n+ contact being on the outer cylindrical surface and the p+ contact being on the inner cylindrical surface, said contacts being generally cylindrical and coaxial, the respective cylinders formed by each of said contacts being open at at least one end thereof, said open ends being adjacent to each other, and one of said contacts being a thin contact, characterized in that the radially-inner portion of the semiconductor is formed with a button-like axial extension beyond the open end of the n+ contact, and that the semiconductor is formed with an annular groove coaxial with the contacts and extending to a position which is closely spaced apart from the thin contact and inward of the open end of the thin contact, whereby, when a reverse bias is applied across the semiconductor between the contacts, the resulting equipotential lines are relatively crowded at the groove, the electric field is of reduced strength adjacent the open end of the thin contact, and reverse leakage current is inhibited.

3. A radiation detector according to claim 1 or 2 wherein the p+ contact comprises implanted boron and the n+ contact comprises diffused lithium.

4. A radiation detector according to claim 1 or 2 wherein the semiconductor is formed of germanium in which the concentration of net residual active impurities is below $5 \times 10^{10}$ cm$^{-3}$.

5. A radiation detector according to claim 1 or 2 wherein the p+ contact is the thin contact.

6. A radiation detector according to claim 1 or 2 wherein the thin contact has a thickness of one micron or less.

7. A radiation detector according to claim 1 or 2 wherein the spacing between the annular groove and the thin contact is 1 mm or less.

* * * * *